(12) United States Patent
Joffe et al.

(10) Patent No.: US 6,580,327 B1
(45) Date of Patent: Jun. 17, 2003

(54) ELECTRONICALLY CONTROLLABLE SLOPE EQUALIZER

(75) Inventors: Daniel M. Joffe, Owens Crossroads, AL (US); Jared Daniel Cress, Decatur, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 10/086,086

(22) Filed: Feb. 28, 2002

(51) Int. Cl.[7] .............................. H03F 3/04; H03F 1/30; H03F 1/00; H03G 3/30
(52) U.S. Cl. ....................... 330/304; 330/284; 330/306; 330/144; 330/151
(58) Field of Search ............................... 330/144, 151, 330/284, 304, 306

(56) References Cited

U.S. PATENT DOCUMENTS

| | | | | |
|---|---|---|---|---|
| 4,757,502 A | * | 7/1988 | Meuriche et al. ........... | 370/318 |
| 5,877,612 A | * | 3/1999 | Straw .......................... | 330/254 |
| 6,215,353 B1 | * | 4/2001 | Lewyn ......................... | 327/538 |
| 6,226,322 B1 | * | 5/2001 | Mukherjee ................... | 375/229 |

* cited by examiner

Primary Examiner—Patricia T. Nguyen
(74) Attorney, Agent, or Firm—Nancy R. Gamburd

(57) ABSTRACT

The present invention provides a slope equalizer for use in a voice frequency channel card, which is preferably electronically and remotely controllable, and retrocompatible with existing telecommunication systems. The slope equalizer of the invention includes a high-pass filter followed by a variable gain stage amplifier, where the variable gain stage amplifier is an operational amplifier with a plurality of parallel input signal paths, each of the signal paths being a series-connected resistor and switch. The switch is preferably a FET transistor that is electronically and, optionally, remotely controllable. The circuit topology allows the use of FET transistors having relatively high on-resistances. A further advantage of the topology is that the FET switches are connected to a virtual ground by way of an operational amplifier, thereby reducing on-resistance modulation caused by signal variations across the FET.

28 Claims, 2 Drawing Sheets

ELECTRONICALLY CONTROLLABLE SLOPE EQUALIZER

FIELD OF THE INVENTION

The present invention relates to telecommunication line conditioning devices. More particularly, the invention relates to an electronically and remotely controllable slope equalizer for wireline signal transmission, such as for twisted pair local loops.

BACKGROUND OF THE INVENTION

1. The Local Loop

In telephony systems, telephone subscriber equipment, such as telephones and modems, are connected to the telecommunication network by way of twisted pairs of copper wires. The wire connection from the telephone network to the customer premise is commonly referred to as the local loop. The local loops from numerous locations terminate at a "central office" ("CO") of the local telecommunication provider or at remote telecommunication pedestals. Channel banks, within the CO, such as exemplary D4 channel banks, convert analog signals from a plurality of loops into a digital form.

Various impairments on the local loop can interfere with communication. One source of impairment, the frequency response characteristic of the local loop, among other things, is a function of the length of the wiring connecting the subscriber to the channel card. That is, as the cable length increases, the varying amounts of attenuation at various frequencies can distort the local loop signals. Typical local loop wiring can range from a few hundred feet, or up to five or six miles, depending on the proximity of the customer premises to the CO.

Typically the attenuation caused by the cable increases with frequency, resulting in significantly more attenuation at higher frequencies. This causes the frequency response to exhibit a "slope" (as typically graphically illustrated as gain versus frequency, measured as the dB difference between two reference frequencies, typically 1004 Hz and 2804 Hz). Some local loops include coils placed along the wires that improve the frequency response characteristic by flattening out this slope. These lines are referred to as "loaded" cables. Even loaded cables, however, can exhibit frequency characteristics with unacceptable amounts of slope. To correct for the slope in the frequency response, slope equalizers are often used.

2. Slope Equalizers

Slope equalizers are used to compensate for the additional attenuation at higher frequencies. By providing varying amounts of gain (or attenuation) with a slope opposite to the frequency response of the cable or transmission line, the slope equalizer may compensate for the frequency response of the local loop.

Variations in the loop characteristics, caused by varying cable lengths and qualities, the presence of loading coils, other line conditions, and so on, make it desirable to have adjustable slope settings for the slope equalizers, to accommodate the characteristics of any given individual loop. Optimal slope settings can be determined from directly measuring the line characteristics. Alternatively, these settings can be prescribed based on features such as whether the cable is loaded or unloaded, the cable gauge, and the cable length.

Local loop slope equalizer settings have been standardized. FIG. 1 is a block diagram illustrating a prior art, manually adjustable slope equalizer 100. The prior art manually adjustable slope equalizer 100 utilizes an operational amplifier ("op amp") 150, having a switch and resistor arrangement 145 fed back into one input, to form a variable-gain portion, with the second input having an input signal $V_{IN}$, followed by a high-pass filter (HPF) 160 and low-pass filter (LPF) 170. The switch and resistor arrangement 145, more particularly, consists of segments of parallel switch and resistor arrangements, with each parallel segment coupled to the others in series (and referred to herein as a series arrangement). The equalization slope is manually set using four designated and standardized switches, referred to in the art as SW1 (105), SW2 (110), SW4 (115), and SW8 (120). The slope setting, k, is determined by the sum of the index numbers on the open switches SWi. As an example, a slope setting of six is achieved when SW1 and SW8 are shorted or closed, and SW2 and SW4 are open, resulting in a short across the R1 (125) (787Ω) and R8 (140) (6.19 KΩ) resistors and open switches across the R2 (130) (1.58 KΩ) and R4 (135) (3.16 KΩ) resistors.

The variable slope portion of the equalizer is typically followed by a high-pass filter 160 and a low-pass filter 170. In the example shown in FIG. 1, the 0.326 uF and 1.96 KΩ resistor form a high-pass filter 160 with a 3 dB high-pass corner frequency at 249 Hz. This provides a modest amount of additional slope that tends to flatten out the low frequency response of the channel by bringing it down slightly. The low-pass filter 170 of the manual, prior art equalizer of FIG. 1 is typically an RC filter. An additional operational amplifier is preferably added in the low-pass filter for isolation.

The switches SW1, SW2, SW4, and SW8 are typically manually configurable switches, such as DIP switches. Manual switches, however, have the disadvantage of requiring a technician to set the slope values by hand. This increases costs of configuring the slope equalizers, considering the many thousands of line cards in a typical central office. Relays or transistors may be used for the switches shown in FIG. 1, thereby providing the added feature of electronic control (which also might be accomplished remotely), but having inherent disadvantages. Mechanical relays, for example, have a relatively large size, high cost, and are susceptible to failure due to the mechanical nature of the devices.

Transistors are smaller, cheaper, and more reliable than relays, but also have significant disadvantages, particularly with regard to introduced distortion and errors due to their non-negligible on-resistance. Inexpensive transistors such as Field Effect Transistors (such as FETs of MOSFETs) have a relatively high on-resistance; as a consequence, when they are in the conductive mode (i.e., the switch is "on"), the resistance across the transistor is non-zero and thereby contributes to the overall feedback resistance. This significant on-resistance introduces error, affecting the desired equalization slope, and resulting in inaccurate settings.

With reference to FIG. 1, as an example, consider the case of slope=1, where all switches except SW1 (105) are closed. The on-resistance of the remaining three switches appears in series with the R1 (125), the 787Ω resistor. When the four switches 105, 110, 115 and 120 are implemented as a typical low-cost FET transistor package, such as an 74HC4316 with four FET switches, each switch has a rated, worst case on-resistance of about 170Ω. Three of these resistors in series with 787Ω causes an effective feedback resistor of 787+3(170)=1297Ω, effectively resulting in the equalizer having an approximate slope=2, rather than the desired slope of 1, introducing a significant error in the frequency response.

In addition, even if the error in the effective resistor value were reduced (by, for example, modifying the scale of the component values throughout the circuit), the variation in the FET's on-resistance as a function of signal voltage would still cause unacceptable amounts of non-linear distortion. While alternative transistor switches for use as SW1–SW8 may be used that will mitigate to some extent the problems discussed above, however, they are considerably more expensive and may be commercially impractical.

As a consequence, a need remains for an improved slope equalizer structure that may be configured electronically and remotely, rather than manually, that has variable slope settings, that has significantly lower distortion and is more accurate than analog switches would be in conventional slope equalizers, and that may be implemented in a small space, in a commercially reasonable manner and at low cost. In addition, a need remains for a slope equalizer structure which accommodates the need to remotely configure the slope settings, such as through programmable switches, and which provides backwards compatibility with standardized slope equalizer settings.

SUMMARY OF THE INVENTION

The present invention provides an improved slope equalizer for use in a voice frequency channel card. The slope equalizer of the present invention includes a high-pass filter stage, followed by a variable gain stage amplifier. In the preferred embodiment, the variable gain stage amplifier is an operational amplifier (op amp (A2)) having first and second inputs; a plurality of parallel input signal paths are provided for the first input of op amp A2, with each of the parallel signal paths being a series-connected resistor and switch, and with the second input of op amp A2 coupled to ground, to provide a virtual ground at the first input of op amp A2. In the preferred embodiment, each of the series switch and resistor combinations are selected to provide retrocompatible programming with standard, prior art equalization configurations.

In parallel with the variable gain stage and high-pass filter stage, in the preferred embodiment, is a unity gain path. The combined output of the variable gain stage and the unity gain stage are input into a summer circuit, which combines the two paths. Preferably, the summer circuit also provides low-pass filtering, eliminating the need for the additional stages of the prior art.

Each of the switches is preferably a FET transistor that is electronically and, optionally, remotely controllable. The circuit topology allows the use of FET transistors having relatively high on-resistances. The on-resistance of each FET switch may be accurately compensated by adjustment of the corresponding series resistor. Once this adjustment is made, all undesired switch interaction based upon on-resistance is removed. A further advantage of the topology is that the FET switches are connected to a virtual ground by way of an operational amplifier, thereby reducing on-resistance modulation or other distortion caused by signal variations across the series-connected resistor-switch combination.

As a consequence, the slope equalizer structure of the present invention may be configured electronically and remotely or locally, rather than just locally. The slope equalizer of the present invention has electronically configurable slope settings using small, inexpensive, easily integrated components. Further, the topology is beneficially arranged to minimize any non-ideal effects of switch on-resistance, as well as minimizing any distortion due to modulation of on-resistance with signal.

Numerous other advantages and features of the present invention will become readily apparent from the following detailed description of the invention and the embodiments thereof, from the claims and from the accompanying drawings.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
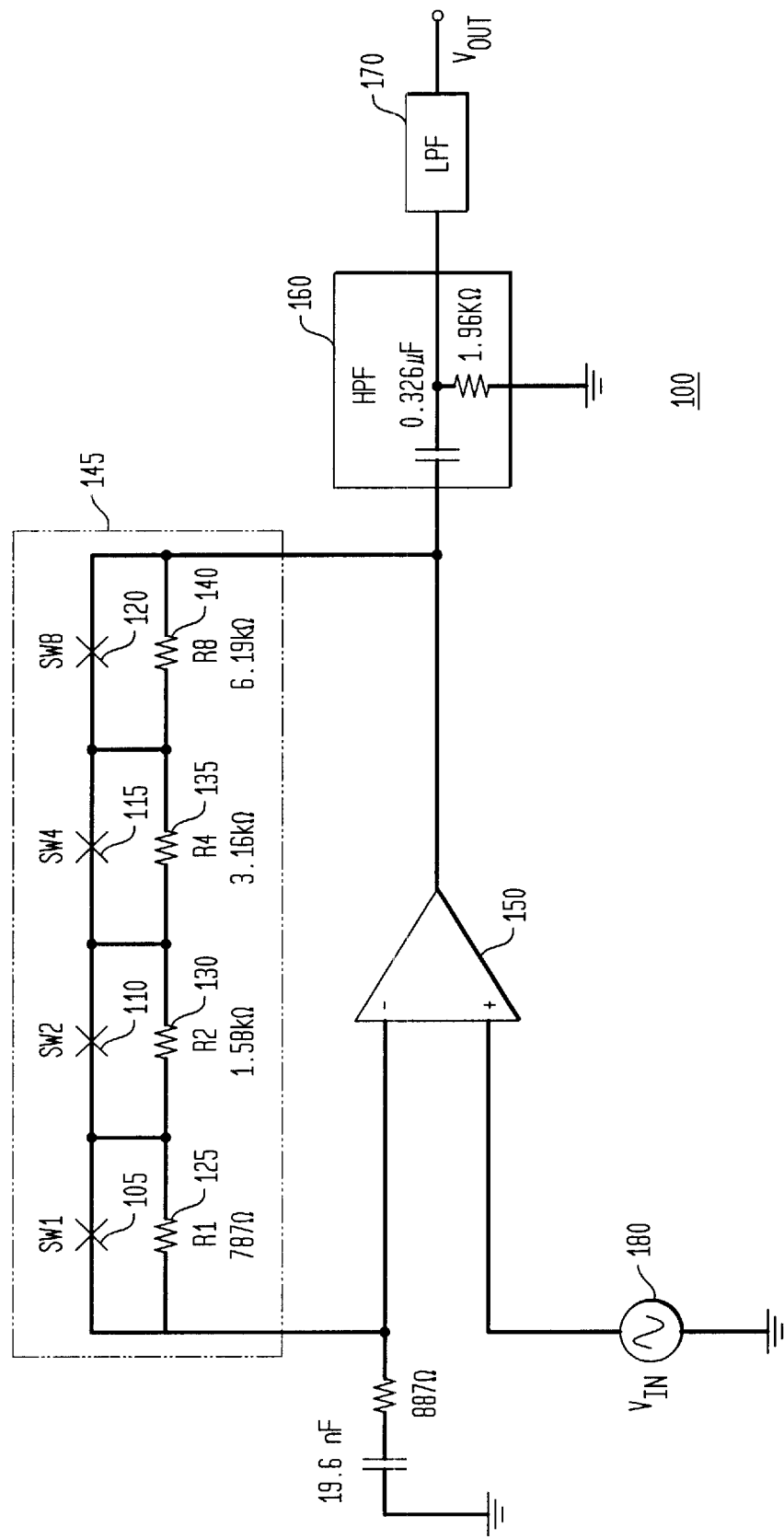
FIG. 1 is a block diagram illustrating a prior art manually adjustable slope equalizer.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

Figure 2:
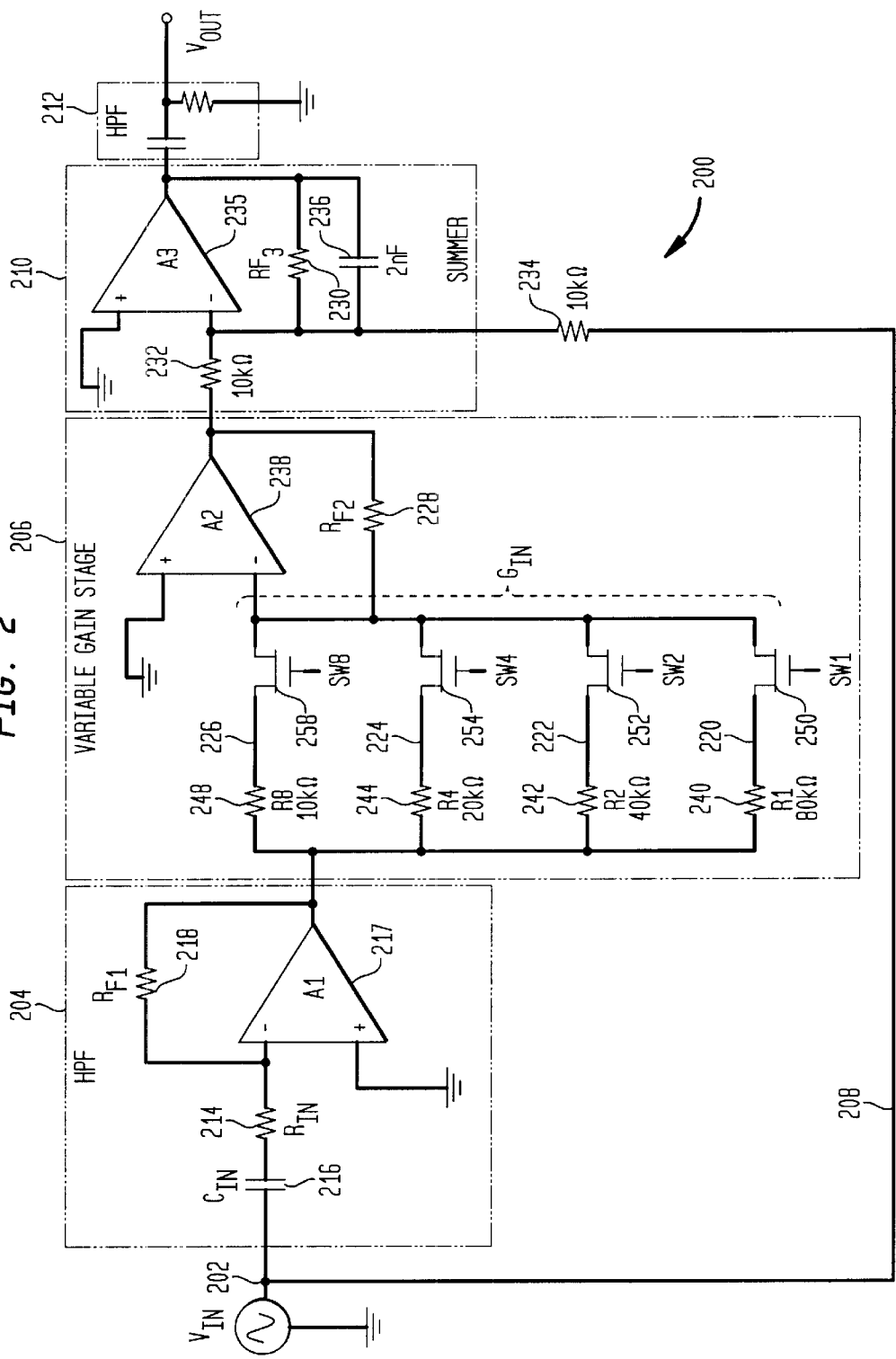
FIG. 2 is a block diagram illustrating a preferred embodiment of a slope equalizer in accordance with the present invention.

FIG. 2 is a block diagram illustrating a preferred embodiment of a slope equalizer 200 in accordance with the present invention. The preferred slope equalizer 200 includes a first high-pass filter 204, a variable gain stage 206, a gain path (preferably but not limited to a unity gain path) 208, a summer 210 (with integrated low-pass filter), and a second high-pass filter 212. An input signal (voltage $V_{IN}$) is applied at input node 202, which is connected to both the first high-pass filter 204 and unity gain path 208. The first high-pass filter 204 is connected to variable gain stage 206. The combination of the first high-pass filter 204, the variable gain stage 206, and the (unity) gain path 208 provides a variable equalization stage. That is, the combination provides an equalization signal path having a variable amount of slope (with a change of the weighting of the first high-pass filter 204, from the variable gain stage 206 relative to the unity gain path 208, providing a variable slope). The unity gain path 208 and the variable equalization stage are summed in summer 210. Summer 210 may also incorporate a low-pass filter structure. The second high-pass filter 212 is connected to the output of the summer 210.

The first high-pass filter 204 is preferably an active single pole filter to provide an initial amount of positive slope, or high-pass gain, with a first operational amplifier A1 (217) which isolates the high-pass corner frequency from interaction with the gain stage. First high-pass filter 204 includes an operational amplifier A1 (217) which, together with input resistor $R_{IN}$ 214 (preferably 17.4 kΩ), input capacitor $C_{IN}$ 216 (preferably 1 nF), and feedback resistor $R_{F1}$ 218 (preferably 17.4 kΩ), form an active high-pass filter with a gain of 1. In particular, the filter has three-dB frequency given by $1/2\pi R_{IN}C_{IN}$ and gain in the pass-band given by gain=$R_{F1}/R_{IN}$. Other preferred embodiments may use alternative structures and arrangements of components to implement the high-pass filter 204, as known to those of skill in the art. For example, inductive components may be used, or a passive high-pass filter could be used, thereby reducing the number of operational amplifiers in the circuit. One preferred embodiment includes amplifier A1 (217) to reduce a risk of overdriving the variable gain stage 206.

Variable gain stage 206 amplifies the signal from first high-pass filter 204, thereby modifying the amount of signal with high frequency emphasis which appears at $V_{OUT}$. The combination of first high-pass filter 204 and variable gain stage 206 provides a variable equalization stage, where the amount of slope is determined by a selected configuration of the plurality of switches SW1, SW2, SW4 and SW8 (respectively switches 250, 252, 254 and 258). Variable gain stage 206 includes operational amplifier A2 (238), feedback resistor $R_{F2}$ 228 (preferably 70.98 kΩ), and a number of parallel input paths (stages or circuits) 220, 222, 224, and 226. The parallel input paths connect the output of high-pass filter 204 to the input of amplifier A2. Each input path is enabled or selected by the activation of the corresponding switches SW1 (250), SW2 (252), SW4 (254), and SW8 (258). Activation of a switch places the respective series-connected resistor into the circuit, thereby modifying the total input conductance $G_{IN}$ seen by op amp A2 (238). Using the general formula for the gain, gain=$R_F \cdot G_{IN}$, it can be seen that various combinations of the four switches modify the value of $G_{IN}$, resulting in sixteen different possible gain or slope settings, depending upon the open or closed state of each such switch SW1 (250), SW2 (252), SW4 (254), and SW8 (258).

In the preferred embodiment, by virtue of the parallel arrangement of $R_1$, $R_2$, $R_4$, and $R_8$, their conductances are additive, such that $G_{IN}=G_i$ when switch SWi is closed. Also in the preferred embodiment, where $G_i=1/R_i$, conductances $G_i$ are established such that $G_{i+1}=2G_i$, resulting in $G_2=2G_1$, $G_4=4G_1$, and $G_8=8G_1$. As illustrated in FIG. 2, preferable resistance values of R1 (240), R2 (242), R4 (244) and R8 (248) are, respectively, 80 kΩ, 40 kΩ, 20 kΩ, and 10 kΩ. The resulting control law provides a gain proportional to the weighted sum of the closed switches. This control law for the new topology of the present invention provides retro-compatibility with applicable standardized control laws of the prior art manually switchable slope equalizers.

The switches SW1 (250), SW2 (252), SW4 (254), and SW8 (258) are illustrated in FIG. 2 as Field Effect Transistor (FET) devices. Alternatively, the switches may be mechanical switches such as DIP switches, micro switches or electromagnetic relays. The switches may also be switchable semiconductor devices such as MOSFETs, OPTOFETs, other types of transistors or the like.

While the switches SW1 (250), SW2 (252), SW4 (254), and SW8 (258) can have a low on-resistance characteristic, the topology of the slope equalizer allows the use of switch devices that have a relatively high on-resistance. On-resistance is the resistance across the device when it is in the conductive mode. The slope equalizer is therefore particularly well-suited for the use of comparatively inexpensive FET transistor devices having nominal on-resistance ratings of between 100Ω and 1000Ω. Depending upon the on-resistance of the transistor or FET that is used, the values of R1 (240), R2 (242), R4 (244) and R8 (248) can be adjusted by lowering the resistance values to make the total input resistance of the respective input path equal the desired amount. For example, with an on-resistance value of 170Ω for SW8, the value of R8 would be 10 kΩ−170Ω=9.83 kΩ.

In the slope equalizer of FIG. 2, the resistance values of resistors R1 (240), R2 (242), R4 (244) and R8 (248) have been scaled to be sufficiently large such that variations in the analog switch on-resistance are fairly negligible. The resistance values of resistors R1 (240), R2 (242), R4 (244) and R8 (248) may be scaled to be lower if transistors (forming SW1 (250), SW2 (252), SW4 (254), and SW8 (258)) having a lower on-resistance are used. For example, the values of R1, R2, R4 and R8 could be scaled down by a factor of two given 50Ω nominal on-resistance switches. In that case, the 10K resistor R8 would become 5000−50=4950 Ohms. Similarly, the values of R1, R2 and R4 would be correspondingly reduced.

In general, the resistance values of resistors R1 (240), R2 (242), R4 (244) and R8 (248) may be determined by the on-resistance of the corresponding switch and by the desired control law for (desired slope of) the equalizer 200. For example, the resistor values may be varied to provide other, additional frequency responses, for additional applications.

The slope of the equalizer 200 is set using the four switches SW1 (250), SW2 (252), SW4 (254), and SW8 (258). As mentioned above, the slope equalizer 200 of the preferred embodiment is retrocompatible (backwards-compatible) with the standardized settings of prior art equalizers. As a consequence, the slope setting, k, is determined by the sum of the index numbers on the closed switches SWi. As an example, a slope setting of six is achieved when SW1 and SW8 are open, and SW2 and SW4 are closed.

As may be apparent from FIG. 2, control of the switches SW1 (250), SW2 (252), SW4 (254), and SW8 (258) may be effected through corresponding control of their respective gate voltages. Not separately illustrated, a control circuit coupled to these gates may be utilized to provide for remote or automatic control. For example, in the slope equalizer 200, the desired slope can be specified using four corresponding data bits, D1, D2, D4, and D8. Each data bit represents whether the corresponding input resistor is effective in the circuit (the corresponding switch SWi is closed), or whether it has been essentially removed from the circuit (the corresponding switch SWi is open). For example, a "1" bit indicates the corresponding resistor is active, while a "0" indicates it is not. In the equalizer of FIG. 2, the indicated switch setting is a logic "true" or "1" when the switch is closed. (In comparison, in the prior art D4 equalizer of FIG. 1, the switch setting is true when the switch is open).

The FETs shown in the embodiment of FIG. 2 are electronically controllable by inputs on their gates. The gate inputs may be provided by appropriate biasing circuits, which may include memory devices or latches to store the desired slope settings. For example, four flip-flops may be inter-connected to the gates of the FET switches SW1–SW8, and then set or reset to control whether the FET is in a conductive or non-conductive state.

Slope equalizer embodiments in channel banks (such as D4 channel banks) that use electronic switches for SW1, SW2, SW4 and SW8 may be set remotely, using techniques known in the art, such as in-band signaling over the T-1 line, or an out-of-band control channel. The settings may be determined using prescription settings for loaded and unloaded cable, cable gauges, and for known lengths of cable. Alternatively, the cable characteristics may be measured or otherwise determined empirically to determine the optimal slope settings.

One potential disadvantage of using prior art series-connected FET devices (as illustrated in FIG. 1) in the input circuit is that the signal variations across the FET may actually cause a change in the on-resistance, since the on-resistance is a function of the drain-to-source voltage and, more particularly, the gate-to-source voltage. A further advantage of the circuit topology of FIG. 2, therefore, is that the input circuit utilizes a virtual ground configuration for the switches. Because the inverting node of the op-amp is at virtually the same voltage as the non-inverting node, which in this case is ground, the gate-to-source voltage variation across the switch is minimized. This has the beneficial effect of decreasing the amount of signal-induced on-resistance modulation, which may otherwise cause non-linear distortion of the signal.

In a further preferred embodiment, not separately illustrated in FIG. 2, a small capacitor may be added across the feedback resistor 228 (of A2 238) to compensate for capacitance due to the switches connected to the inverting node.

The summer 210 includes (third) operational amplifier A3, (third) feedback resistor $R_{F3}$ 230, and input resistors 232 and 234 (as part of unity gain path 208). The summer 210 adds the signals from the unity gain path 208 and the variable equalization stage (204 and 206). In yet another embodiment, as illustrated in FIG. 2, a capacitor 236 may be added in parallel with the feedback resistor 230 to further provide a low-pass filtering effect. Finally, high-pass filter 212 may be utilized to provide additional signal shaping.

In summary, the preferred equalizer 200 utilizes a unique topology to provide a highly accurate, low distortion equalizer for reducing the line impairments of voice frequency circuits. The preferred equalizer 200 topology allows for the use of comparatively inexpensive, commercially-feasible FET switches having relatively high on-resistance, while simultaneously minimizing the signal voltage across each switch and minimizing distortion. The preferred equalizer 200 is backwards-compatible with existing slope equalizers, for comparatively easy field deployment, providing a mapping between the control settings and frequency response which is exactly the same as the standard D4 equalizer (given the earlier mentioned inversion of the switch action (a switched is closed on the new equalizer to insert slope equalization)). In addition, the preferred equalizer may be configured electronically and remotely.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

We claim:

1. A slope equalizer, the slope equalizer coupleable to an input signal, the slope equalizer comprising:
    a high-pass filter;
    a variable gain amplifier connected to the high-pass filter, the variable gain amplifier comprising an operational amplifier having a plurality of parallel-connected switchable input circuits;
    a gain path connected in parallel with both the high-pass filter and the variable gain amplifier; and
    a summer connected to the variable gain amplifier and the gain path.

2. The slope equalizer of claim 1, wherein the plurality of parallel-connected switchable input circuits are electronically controllable.

3. The slope equalizer of claim 1, wherein the plurality of parallel-connected switchable input circuits are remotely controllable.

4. The slope equalizer of claim 1, wherein each of the switchable input circuits, of the plurality of parallel-connected switchable input circuits, comprises a series-connected resistor and switch.

5. The slope equalizer of claim 1, wherein each of the switchable input circuits, of the plurality of parallel-connected switchable input circuits, comprises a series-connected resistor and transistor.

6. The slope equalizer of claim 5, wherein each transistor of the switchable input circuits is a field effect transistor (FET).

7. The slope equalizer of claim 5, wherein, for each switchable input circuit of the plurality of switchable input circuits, the resistance value of each resistor is adjusted to compensate for an on-resistance of each corresponding transistor.

8. The slope equalizer of claim 1, wherein each of the switchable input circuits, of the plurality of parallel-connected switchable input circuits, comprises a series-connected resistor and transistor, wherein each corresponding series-connected resistor of the plurality of parallel-connected switchable input circuits has a conductance $G_i$, and wherein $G_{i+1}=2G_i$.

9. The slope equalizer of claim 1, wherein the summer further comprises a feedback capacitor for providing a low-pass filter effect.

10. The slope equalizer of claim 1, wherein each of the plurality of parallel-connected switchable input circuits is connected to a virtual ground.

11. The slope equalizer of claim 1, wherein the gain path is a unity gain path.

12. A slope equalizer for use in a voice frequency channel card to provide an equalized output signal from an input signal, the slope equalizer comprising:
    a high-pass filter coupleable to the input signal;
    a unity gain stage coupleable to the input signal;
    a variable gain stage amplifier coupled to the high-pass filter, the variable gain stage amplifier comprising a first operational amplifier, the first operational amplifier having a first input coupleable to a ground voltage, the first operational amplifier having a second input having a plurality of parallel input signal paths, each input signal path of the plurality of parallel input signal paths comprising a series-connected resistor and switch, each of the switches having a conducting state and a non-conducting state in response to an applied control voltage; and
    a second operational amplifier connected to the variable gain stage amplifier and to the unity gain stage, the operational amplifier configured as a summer to combine a first signal from the variable gain stage amplifier with a second signal from the unity gain stage, the operational amplifier providing the equalized output signal.

13. The slope equalizer of claim 12, wherein each switch of the plurality of parallel input signal paths is a transistor.

14. The slope equalizer of claim 13, wherein the values of each of the resistors are adjusted to provide, in combination with the conducting state or non-conducting state of a corresponding series-connected transistor, a selected frequency response of the slope equalizer.

15. The slope equalizer of claim 13, wherein, for each transistor, the applied control voltage is applied electronically and remotely.

16. A slope equalizer apparatus comprising:
    a signal input node;
    a high-pass filter connected to said signal input node;
    a variable gain amplifier connected to said high-pass filter, said variable gain amplifier comprising an operational amplifier having a plurality of parallel-connected switchable input circuits;
    a gain path connected to said signal input node; and, a summer connected to said variable gain amplifier and said gain path.

17. The slope equalizer of claim 16, wherein the gain path is a unity gain path.

18. The slope equalizer of claim 16, wherein said switchable input circuits are electronically and remotely controllable.

19. The slope equalizer of claim 16, wherein each of said switchable input circuits comprises a series-connected resistor and a field effect transistor (FET).

20. The slope equalizer of claim 16, wherein each of the switchable input circuits, of the plurality of parallel-connected switchable input circuits, comprises a series-connected resistor and transistor, wherein each corresponding series-connected resistor of the plurality of parallel-connected switchable input circuits has a conductance $G_i$, and wherein $G_{i+1}=2G_i$.

21. The slope equalizer of claim 16, wherein each of the plurality of parallel-connected switchable input circuits is connected to a virtual ground.

22. A slope equalizer for use in a channel card, said slope equalizer comprising a high-pass filter followed by a variable gain stage amplifier, said variable gain stage amplifier comprising an operational amplifier having a plurality of parallel input signal paths, each of said signal paths comprising a series-connected resistor and transistor.

23. The slope equalizer of claim 22, further comprising:
a unity gain path; and,
a summer for combining signals from said unity gain path and said variable gain amplifier.

24. The slope equalizer of claim 23, wherein said summer further comprises a feedback capacitor, thereby providing a low-pass filtering effect.

25. The slope equalizer of claim 22, wherein each of said plurality of parallel input signal paths is connected to a virtual ground.

26. The slope equalizer of claim 22, wherein said switches are electronically controllable.

27. The slope equalizer of claim 22, wherein said switches are remotely controllable.

28. A slope equalizer, said slope equalizer comprising a high-pass filter followed by a variable gain stage amplifier, said variable gain stage amplifier comprising a means for amplification and a means for providing selectable parallel input paths.

* * * * *